United States Patent [19]

Lecklider

[11] 4,208,723
[45] Jun. 17, 1980

[54] DATA POINT CONNECTION CIRCUITRY FOR USE IN DISPLAY DEVICES

[75] Inventor: Thomas H. Lecklider, Bishop's Stortford, England

[73] Assignee: Gould Inc., Rolling Meadows, Ill.

[21] Appl. No.: 855,522

[22] Filed: Nov. 28, 1977

[51] Int. Cl.² .................................................. G06F 3/14
[52] U.S. Cl. .................................... 364/900; 340/722; 340/728; 340/747; 364/723
[58] Field of Search ... 364/900 MS File, 200 MS File, 364/521, 723; 340/324 A, 324 AD, 324 M, 722, 728, 747; 358/242; 315/169 TV

[56] References Cited

U.S. PATENT DOCUMENTS

| | | | |
|---|---|---|---|
| 3,109,166 | 10/1963 | Kronenberg et al. | 340/324 AD X |
| 3,469,252 | 9/1969 | Bet | 340/722 X |
| 3,598,911 | 8/1971 | Helbig | 340/324 AD X |
| 3,648,270 | 3/1972 | Metz et al. | 340/722 |
| 3,668,687 | 6/1972 | Hale | 340/324 AD |
| 3,680,076 | 7/1972 | Duffek et al. | 340/324 AD |
| 3,697,955 | 10/1972 | Bryden et al. | 340/324 A X |
| 3,701,988 | 10/1972 | Allaart | 340/324 AD |
| 3,735,385 | 5/1973 | Schroder et al. | 340/324 AD |
| 3,760,405 | 9/1973 | Ishii et al. | 340/324 AD |
| 3,792,464 | 2/1974 | Hamada et al. | 340/324 AD |
| 3,810,166 | 5/1974 | Atkin | 340/324 AD |
| 3,836,902 | 9/1974 | Okuda et al. | 340/324 AD |
| 3,878,536 | 4/1975 | Gilliam | 340/324 AD |
| 3,893,075 | 7/1975 | Orban et al. | 340/747 X |
| 3,902,476 | 9/1975 | Hileman | 340/747 X |
| 3,930,250 | 12/1975 | Blejwas, Jr. et al. | 340/324 A |
| 3,968,499 | 7/1976 | Lowe et al. | 340/747 X |
| 3,979,742 | 9/1976 | Kolb et al. | 340/324 AD |
| 3,984,828 | 10/1976 | Beyers, Jr. | 340/324 AD |
| 4,002,828 | 1/1977 | Nolan | 340/324 M |
| 4,011,556 | 3/1977 | Tochitani et al. | 340/324 AD |
| 4,023,165 | 5/1977 | Holt et al. | 340/722 X |
| 4,038,668 | 7/1977 | Quarton | 340/324 AD X |
| 4,068,310 | 1/1978 | Friauf | 364/521 |
| 4,090,188 | 5/1978 | Suga | 340/324 AD |
| 4,095,216 | 6/1978 | Spicer | 340/324 AD |

*Primary Examiner*—Melvin B. Chapnick
*Attorney, Agent, or Firm*—Thomas E. Kocovsky, Jr.; Charles E. Snee, III; Russell E. Baumann

[57] ABSTRACT

In a system for producing a display in an x,y coordinate system which system produces only a single display point for each display position on the x-axis, a circuit for producing rise lines and fall lines parallel to the y-axis to connect the display points in adjacent positions on the x-axis. The circuit includes a shift register for storing a line of data, a shift register for storing rise line positions, a shift register for storing fall line positions, and AND gates for terminating rise lines and fall lines upon reaching a display in an adjacent position on the x-axis.

6 Claims, 4 Drawing Figures

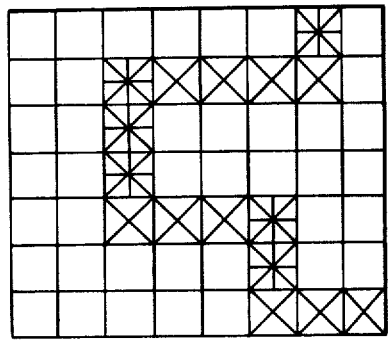

FIG.2

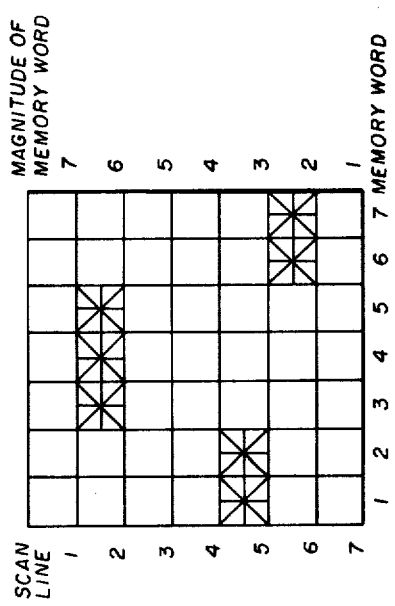

FIG.3

| | SCAN LINE 1 | SCAN LINE 2 | SCAN LINE 3 | SCAN LINE 4 | SCAN LINE 5 | SCAN LINE 6 | SCAN LINE 7 | SCAN LINE 8 |
|---|---|---|---|---|---|---|---|---|
| A = INPUT DATA | 0000000 | 0011100 | 0000000 | 0000000 | 1100000 | 0000011 | 0000000 | 0000000 |
| A' | 0000000 | 0000000 | 0011100 | 0000000 | 0000000 | 1100000 | 0000011 | 0000000 |
| B | 0000000 | 0001110 | 0000110 | 0000000 | 0110000 | 0000001 | 0000000 | 0000000 |
| B' | 0000000 | 0000000 | 0001110 | 0000000 | 1010000 | 0110000 | 0000001 | 0000000 |
| C = $\bar{A} \cdot B + A \cdot \bar{B}$ | 0000000 | 0010010 | 0001010 | 0000000 | 0111111 | 0111101 | 0000001 | 0000000 |
| D = $\overline{C \cdot \bar{A}}$ | 1111111 | 1101111 | 1111111 | 1111111 | 1101111 | 1111101 | 1111111 | 1111111 |
| E = $\overline{C \cdot B}$ | 1111111 | 1111101 | 1111111 | 1111111 | 0101111 | 1001111 | 1111111 | 1111111 |
| F = $\overline{(F' \cdot D \cdot K) + (A \cdot C \cdot G')}$ | 1111111 | 1111111 | 1101111 | 1101111 | 0101111 | 0101111 | 0111111 | 1111111 |
| F' | 1111111 | 1111111 | 1111111 | 1101111 | 1111111 | 1101111 | 0111111 | 1111111 |
| G = $\overline{(\bar{G}' \cdot E \cdot L) + (B \cdot C \cdot F')}$ | 1111111 | 1111101 | 1111111 | 1111111 | 1111111 | 1101111 | 1111111 | 1111111 |
| G' | 1111111 | 1111111 | 1111101 | 1111111 | 1111111 | 1111111 | 1101111 | 1111111 |
| K = $\overline{B' \cdot F'}$ | 1111111 | 1111111 | 1111111 | 1111111 | 1111111 | 1111111 | 1111111 | 1111111 |
| L = $\overline{A \cdot \bar{G}'}$ | 1111111 | 1111111 | 1111111 | 1111111 | 1111111 | 1111111 | 1111111 | 1111111 |
| OUTPUT = $B + \bar{F}' + \bar{G}'$ | 0000000 | 0000000 | 0011110 | 0010010 | 0010010 | 1110010 | 1000011 | 1000000 |

FIG.4

DATA POINT CONNECTION CIRCUITRY FOR USE IN DISPLAY DEVICES

BACKGROUND OF THE INVENTION

In a typical raster scan type cathode ray tube, an image is generated by allowing a scanning electron beam to strike the phosphor on the face of the cathode ray tube only at selected locations and by blanking or keeping off the electron beam as it scans over all other locations. To maintain an image generated in this manner on the cathode ray tube it is necessary for the electron beam continuously to repeat scanning the same data. To allow this repeated scanning, the data is normally stored in a memory. In the past, the memory, in order to be able to address any point on the face of the cathode ray tube, had to contain M storage positions, where M is equal to the number of scan lines per frame times the number of elements of resolution in one scan line. A display, for example, of 240 visible scan lines and 256 resolvable elements per scan line, about half the number of points as the standard TV screen, would require 240×256 or 61,440 addressable memory points. If the beam is to be switched on or off at each location, storage elements are only required to be single bit memorys.

The present invention has found that in the special case of a display of a wave form which is single valued in one direction, i.e., perpendicular to the scan line, the number of storage positions need only be equal to the number of resolvable elements in one scan line. Each storage position must be large enough to indicate which scan line the display at the resolvable element it represents is to appear. In the example given above of 240 visible scan lines and 256 resolvable elements, 256 storage positions would be required. Each of the storage positions would have to be able to address any one of the 240 lines. This is to say, each storage position must have the ability to take any one of 240 different values. In the case of a solid state memory made up of memory bits, each bit having two states, each memory position must have N memory bits where $2^N \geq$ number of scan lines. To be able to address 240 different scan lines, eight memory bits are needed. Thus, 256 memory positions, each with eight bits, uses 2,048 bits of memory as opposed to the 61,440 bits used in a 256×240 bit matrix memory. Of course, the present invention applies to displays of any size.

If there is only one storage position for each position along the raster scan lines, then the data at that position can be displayed on only one scan line. Such a display on a cathode ray tube would appear as a series of disjointed points or horizontal line segments; vertical lines could not be displayed. The present invention, without increasing the amount of memory required, generates vertical lines to connect each of the points or horizontal line segments. Thus, the present invention allows any single valued function such as a sine wave, series of step functions, or exponential, to be stored as discrete points or horizontal line segments, yet to be displayed as a continuous function.

The present invention can supply vertical connecting lines for discrete data points or horizontal line segments.

The present invention generates the vertical rise and fall lines to connect the dots. A rise line is the line at the beginning of a single data point or horizontal line which extends upward from a lower preceding data point or the end of the preceding line. A fall line is the vertical line at the end of a horizontal line or data point which extends downward to connect it to a lower next following data point.

BRIEF DESCRIPTION OF THE DRAWINGS

FIG. 2 is a representation of data points;

FIG. 3 is a graphical representation of the data points of FIG. 2 with vertical connecting lines supplied in accordance with the invention; and FIG. 4 is a chart showing the values at various points within the circuit of FIG. 1 when the data of FIG. 2 is processed therethrough.

DESCRIPTION OF THE PREFERRED EMBODIMENT

Figure 1:
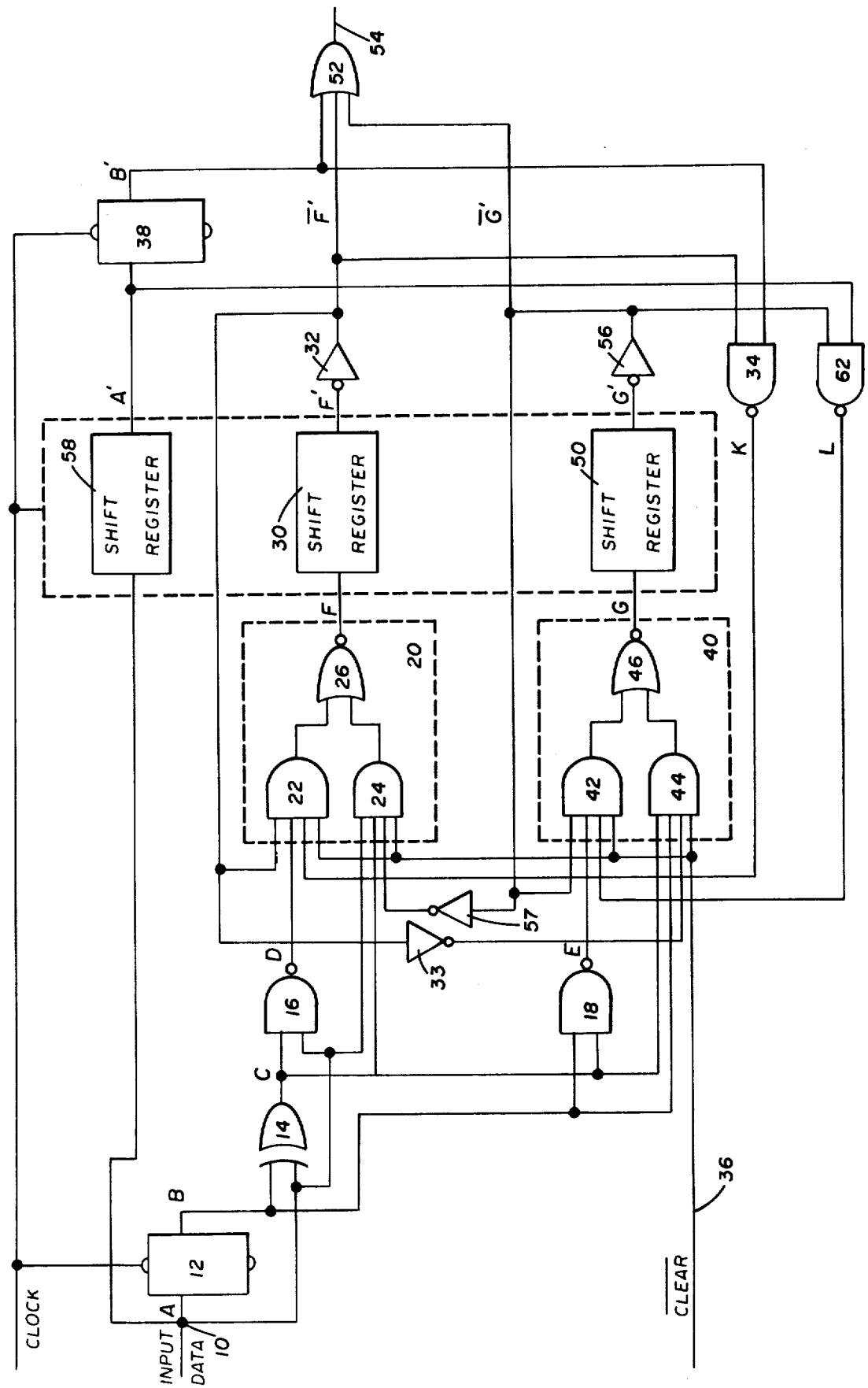
FIG. 1 shows a circuit diagram in accordance with the present invention.

The invention is designed to generate connecting data lines between adjacent horizontal (one point will be treated as a horizontal line) lines. Data in the form of a series of high or low pulses is read into the circuit and stored. The invention determines whether a rise line and/or a fall line should be initiated, and if so, in what position. If a rise or fall line is initiated, the invention stores data indicative of the position for repetition in succeeding lines. Further, the invention determines whether any of the read data meets the conditions necessary for terminating an already stored rise or fall line. Having determined all this, the invention generates a display of the data read in along with the rise and fall lines that it has generated.

Looking to FIG. 1, data in the form of a series of high and low pulses, the number of pulses corresponding to the number of elements of resolution in one scan line, come into the circuit on line 10. Typical raster scan displays have 525 scan lines, each with 512 elements of resolution, but other sizes could be used. This series of pulses is designated as A. The data A is fed into a flip flop switch 12 which is sequenced by clock pulses. An output B from flip flop switch 12 is the data A delayed by one clock pulse.

Data A and B are both fed to an exlcusive OR gate 14. The series of output pulses from gate 14 designated C are high whenever one, but not both, of the pulses in the corresponding clock position of signals A and B is high. C is low whenever the pulse in the corresponding position in both A and B is the same, i.e., either both are high or both are low.

Signals C and A are fed to the inputs of inverting AND gate 16. The output signal D is low whenever the corresponding pulses in A and C are both high, otherwise the output pulse of D is high. It will be noticed that D will be high in all positions except those corresponding to a single high pulse in the pulse train A or in the position corresponding to the first high pulse in a string of sequential high pulses in pulse train A. Thus, the signal D marks the position at which the circuit will generate a rise line to connect the actual data points. Similarly, signals C and B are fed to inverting AND gate 18 to create an output signal E. Signal E will indicate the position of a fall line. Signal E will be high for all inputs except for those pulses which are in the position corresponding to the last high pulse in a line of high pulses in signal B or corresponding to a single high pulse in signal B. Thus, the fall line is created one clock pulse past the end of a series of high clock pulses in pulse train A.

Going back to the rise generator circuit, there is an AND-OR-INVERT gate 20 which is composed of two AND gates 22 and 24 on an inverting OR gate 26. The input to AND gate 22 is the pulse train F' stored in shift register 30 from the last scan line which has been inverted with inverter 32. The second input is signal D; the third input is a signal K from inverting AND gate 34, which compares the shift register data indicative of the rise time stored from the preceding scan line with data stored from the previous scan line. Signal K from inverting AND gate 34 will be low only when the rise line is to be terminated. Signal K will be explained in more detail later. The fourth and final input to AND gate 22 is the clear signal on clear line 36. The clear signal will be high during all normal operations of the circuit and will only go low when it is desired to erase or reset the circuit. AND gate 22, then, passes the rise indication signals on through, except in two situations. The first situation is when there is already data stored in shift register 30 in the position corresponding to the rise line. The second situation is that in which there is both a low signal in the corresponding position in shift register 30 and there is a high signal from flip flop 38. It will be seen that the signal from flip flop 38 designated B' represents the actual data from the preceding scan line delayed by one clock pulse. Thus, the rise line will not be generated if there is a high signal in the preceding scan line in the position one clock pulse before the proposed rise line position.

AND gate 24 also has four inputs. The first is signal A, the second signal C, the third is the inverse of the output of INVERTER 56, the signal being inverted through INVERTER 57 (which would be high in all positions except the position in which there is a fall line being generated), and the fourth is the clear signal. AND gate 24, then, will generate a high output pulse only when the corresponding position of signal A is high and signal B is low and the fall line signal G' is high.

Inverting OR gate 26 combines the outputs of AND gates 22 and 24 to produce a signal F which will be high under all conditions except in the pulse position corresponding to the position of a rise line, either being started with this line of data or being recirculated from a previous line of data.

The signal F is then stored in shift register 30 which has one storage position for each element of resolution of a scan line. Shift register 30 is sequenced by a clock pulse generator such that in each scan line the data already in shift register 30 is stepped out one pulse at a time and sequenced with the new data arriving on line 10. Thus, the output of shift register 30 is a pulse train one scan line delayed from the data being read. The data from shift register 30 passes through inverter 32 from which the information is recirculated back to AND gate 22, INVERTER 33 and to OR gate 52. This will create an output signal on line 54. The output of INVERTER 33 is one of the inputs to AND gate 44. In the clock pulse position corresponding to the position (if any) of a rise line in the last scan line, there will be a high pulse.

Similarly, AND-OR-INVERT gate 40 is made up of an AND gate 42, second AND gate 44, and an inverting OR gate 46. Just as in AND-OR-INVERT gate 20, the two AND gates each ascertain whether or not one of the two alternative conditions are met for generating/terminating a fall line. The two conditions are combined in inverting OR gate 46. This output, designated signal G, will have a high output pulse in the position corresponding to the position in which a fall line is to be started in the next scan line. In the next scan line, the output G' from shift register 50 is passed through inverter 56 and recirculated back to AND gate 42 as well as passed to OR gate 52 to create an output on line 54 which has a high pulse at those positions corresponding to a fall line stored in shift register 50.

The real data coming in on line 10 is also fed to a shift register 58. The real data is stored there for one scan and is fed out of shift register 58 in the subsequent scan line. This real data delayed by one scan line is designated as data A'. The data A' goes to flip flop 38, discussed above, where it is delayed by one clock pulse to produce signal B'. The signal B' is fed to inverting AND gate 34, discussed above, and to OR gate 52. This produces output pulses on line 54 which are high pulses in positions corresponding to one clock pulse past high pulses in the actual data read in the preceding scan line. The output A' from shift register 58 is further fed to inverting AND gate 62 which produces a signal L analogous to signal K, discussed above, in the rise line generating situation. Signal L stops the recirculation of fall line data back into shift register 50 when the fall line reaches a high pulse in the data A' in the same position. This cuts off fall lines.

The circuit can perhaps be most fully understood by following a set of data through it. The example which follows will outline how the circuit will transform the data points shown in FIG. 2 into the continuous visual display shown in FIG. 3. The example will show a 7×7 input array and a 7×8 scan line output array. These are much smaller arrays than would normally be used in practice and are chosen this small for simplicity of illustration. This data could be stored in a memory made up of seven storage elements (one for each of the seven resolution positions per scan line) each element having three bits of storage ($2^3$32 8, so each of the seven scan lines can be uniquely addressed). Thus a total of twenty-one bits of storage are used—much less than the forty-nine bits of storage that a 7×7 array of one bit memory elements would use. FIG. 4 illustrates the signals at various labeled points in the above circuit during each of the eight scan lines. By way of convention, zeros are used to denote a low pulse and ones a high pulse. Although the term pulse will be used throughout, it is understood that a string of seven low pulses would be merely a continuous low voltage on the line during each clock pulse and a series of high pulses would be actually a continuous high voltage on the line during the appropriate number of clock pulses.

Considering FIGS. 2, 3 and 4: FIG. 2 perhaps should be thought of as seven memory words, each word capable of having any one of seven values. It will be seen that in the first scan line of FIG. 2 there is no data, i.e. none of the data words has a value of seven. Accordingly, the input A to the circuit during the first scan line would be all low pulses. This data or lack of data would have no effect on the circuit and would produce an output of all low pulses.

In the second line of FIG. 2, it will be seen that there are three bits of data which will produce the string of input data shown in the second column (scan line 2) of FIG. 4. It will be seen that during the second scan line the inverting AND gate 16 produces a signal D which indicates the position for the rise line by having a low pulse in its third position, the position corresponding to the beginning of the line of data. Further, through AND-OR-INVERT gate 20, this position indication from signal D is also transferred to signal F. Similarly, signal E detects the position for a fall line and, through AND-OR-INVERT gate 40, transfers this information to signal G. Signals F and G are then stored in shift registers 30 and 50, respectively. The output, it will be seen, is actually one scan line delayed. The signals B, $\overline{F'}$, and $\overline{G'}$ will all be low. Accordingly, there will be no output displayed in the second scan line.

Looking to the third line of FIG. 2, it will be seen that there is no data represented on that line. Accordingly, the input to the circuit will be a string of all low pulses as illustrated in FIG. 4, column 3. It will be seen, then, that signals D and E will indicate no rise or fall lines. Signal F, however, is a composite, not only of the input from the signal D but from the recirculating line, through which the data in shift register 30 can be returned to the input of AND-OR-INVERT gate 20 and repeated in subsequent signals F. Similarly, the data in shift register 50 is recirculated onto subsequent signals G. It will be seen, then, that the output on line 54 will be high at the pulse positions, that B' is high, or $\overline{F'}$ is high, or $\overline{G'}$ is high. Thus, the data read in in scan line 2 is now displayed as the three blocks of line 3 of FIG. 3 marked with a star. Also, the first rise line point is displayed as the square in line 3 of FIG. 3 marked with an X. Further, it will be seen that the information concerning the rise and fall lines in signals F' and G' have been recirculated back into shift registers 30 and 50 respectively so that that information has been retained.

It will be seen that in FIG. 2, the fourth scan line also has no data. Accordingly, the input to the circuit will again be a string of all low pulses. Again, there being no new data, signals D and E will generate no new rise or fall lines. The signals F' and G' which indicate the location of the rise and fall lines respectively will be recirculated back into their respective shift registers and retained. The output in this scan line is again high in the positions corresponding to pulses in any one of B', $\overline{F'}$, or $\overline{G'}$. In this case, that would be a high pulse at the rise and fall line positions, which is to say, positions 3 and 6 respectively, marked with an X in line 4 of FIG. 3.

Going on to the fifth line of FIG. 2 (column 5 of FIG. 4), it will be seen that there are data points to be read in the first two positions. Thus, the input pulse to the circuit will be two high pulses in the first two positions. Because of the new input data, signal D will indicate a rise line position and signal E a fall line position. The signal F, it will be seen, will have the old rise line position recirculated back into it and have the new position from signal D added to it. This produces a new signal F for storage in shift register 30 which indicates two rise lines. The new fall line position indicated by signal E will not, however, appear as part of signal G. It will be seen that signal G would have had this fall line added to it, except that the second half of the expression for G from AND gate 44 acts as a filter which filters out fall lines which are in the same position as a currently existing rise line. Thus, the new fall line indicated in signal E is not passed to signal G. Signal G has only the previous fall line from signal G' recirculated back into itself. The output for line 5 will again be high in those clock pulse positions corresponding to high pulses in any one of B', $\overline{F'}$, or $\overline{G'}$. In this case, that would again be only the rise and fall lines generated in the previous scan line in the third and sixth positions.

In line 6 of FIG. 2, it will be seen that there are again two more data points to be read in. Signal D generates a rise line signal indication, but signal E, because the new data is at the end of the line, is unable to generate a possible fall line position. The new rise line in the fifth position of signal D is prohibited by AND gate 24 of AND-OR-INVERT gate 20 from being put into signal F. AND gate 24 prohibits formation of a rise line in the same position as an existing fall line. In this case, there already was a fall line in the sixth position and, accordingly, the new rise line was filtered out. Gate 34 has also detected the coincidence in the third position of a pulse of delayed input data, signal B', and an indication of a rise line in signal F'. Signal K, the output of gate 34, then goes low in the third position. Signal K in AND gate 22 of AND-OR-INVERT gate 20 acts to block the signal indicative of the rise line in the third position from being recirculated. Accordingly, the new signal F will only have a low pulse in the first position to indicate one rise line. Signal G is recirculated unaffected. The output again is high in those pulse positions corresponding to a high pulse in any one of signals B', $\overline{F'}$, or $\overline{G'}$. This produces the output shown by X's and stars in the sixth line of FIG. 3.

In line 7, it will be seen that FIG. 2 supplies no input data. Inverting AND gate 62 will detect that data read in the previous line had a high pulse in the sixth position and that signal G' indicated a fall line in the sixth position. Gate 62, through signal L, causes AND gate 42 to cut off the recirculation of this fall line. The output on line 54 then will have a high pulse in the first position from the recirculating rise line, a high pulse in the sixth position from the fall line which was just cut off, and a high pulse in the seventh position from the high pulse input in line 6 in the sixth position.

There is no line 8 of FIG. 2; accordingly, there would be no input data. There having been no input for two lines, shift register 58 is empty. Since the fall line was cut off in the previous line, shift register 50 has no data. The only output is from the recirculating rise line in the first position from shift register 30.

Thus, it can be seen that the present circuit connects horizontal line segments of single valued functions into a continuous line representation. It is equally applicable to discrete data points. Because the invention doubles each discrete point into two points, each point becomes a horizontal line. A single valued function in the scan direction of any shape can be displayed as a series of very small step functions.

The invention is applicable to any x,y matrix type display such as plasma display panels, television type displays, electrostatic ink or thermal recorders which scan across the paper incrementing scan lines in step with paper motion, and ink jet recorders.

Further, a plurality of single valued functions could be displayed, one above the other.

Additional circuitry can be added to remove the rise line in the first position. This could be done by forcing signal L to zero in the first position, for example.

The invention is not limited to the specific circuit of FIG. 1, but includes all the alterations and variations thereto as encompassed within the scope of the claims as follows.

I claim:

1. A system for interpolating data for use in a display device, said system comprising:
   means for receiving a set of data comprising a plurality of lines of data one line at a time wherein a set of data can be a line of data;
   means electrically connected to said receiving means for determining each starting and stopping position of said data within said line of data received, said means for determining further comprising a first means for producing a signal indicative of the starting position of said line of data and a second means for producing a signal indicative of the stopping position of said line of data;

means electrically connected to said means for determining having an input and an output for storing the signals produced by said means for determining wherein said means for storing further comprises a first storage means for storing the signal indicative of the starting position of said line of data and a second storage means for storing the signal indicative of the stopping position of said line of data;

means electrically connected to said means for storing for recirculating the signals in said means for storing wherein said means for recirculating further comprises a first recirculation means connected to the output of said first storage means to recirculate the signal indicative of the starting position of said line of data back to the input of said first storage means for every successive line of data received and a second recirculation means connected to the output of said second storage means to recirculate the signal indicative of the stopping position of said line of data back to the input of said second storage means for every successive line of data received;

means electrically connected to said means for storing for producing an output signal indicative of both said lines of data received on the signals in said means for storing whenever said means for determining determines a starting and stopping position of said data within said line of data such that said lines of data received will be connected by the signals indicative of the starting and stopping position of said lines of data; and output means electrically connected between said means for producing and said display device for passing the produced signal to said display device whenever a signal is produced.

2. The system of claim 1 further comprising a first blocking means controlled by said second means for producing a signal indicative of the stopping position of said line of data to block the recirculation of the signal in said first storage means when the lines of data are connected and a second blocking means controlled by said first means for producing a signal indicative of the starting position of said line of data to block the recirculation of the signal in said second storage means when the lines of data are connected.

3. The system of claim 1 further comprising a third blocking means controlled by said second recirculation means and electrically located between said first means for producing a signal indicative of the starting position of said line of data and said first storage means for selectively blocking the passage of signals between the first means for producing and said first storage means when the lines of data are connected, and a fourth blocking means controlled by said first recirculation means electrically located between the second producing means and said second storage means for blocking the passage of signals between the second producing means and said second storage means when the lines of data are connected.

4. The system of claim 1 further comprising a delay means between said means for receiving and said output means to delay the received line of data by one line and wherein the signals at the output of said first storage means are one line delayed from the signals at the input to said first storage means and wherein the signals at the output of said second storage means are one line delayed from the signals at the input to said second storage means.

5. The system of claim 4 in which said delay means and said first storage means and said second storage means are shift registers.

6. The system of claim 4 in which the output signal from said output means is one line delayed from the received line of data.

* * * * *